United States Patent
Takshi

(10) Patent No.: US 10,069,459 B1
(45) Date of Patent: Sep. 4, 2018

(54) SOLAR CELLS HAVING INTERNAL ENERGY STORAGE CAPACITY

(71) Applicant: Arash Takshi, Tampa, FL (US)

(72) Inventor: Arash Takshi, Tampa, FL (US)

(73) Assignee: University of South Florida, Tampa, FL (US)

( * ) Notice: Subject to any disclaimer, the term of this patent is extended or adjusted under 35 U.S.C. 154(b) by 670 days.

(21) Appl. No.: 14/518,333

(22) Filed: Oct. 20, 2014

Related U.S. Application Data

(60) Provisional application No. 61/893,487, filed on Oct. 21, 2013.

(51) Int. Cl.
| | |
|---|---|
| *H02S 40/38* | (2014.01) |
| *H01G 9/00* | (2006.01) |
| *H02J 7/35* | (2006.01) |
| *H01L 31/02* | (2006.01) |

(52) U.S. Cl.
CPC ............. *H02S 40/38* (2014.12); *H02J 7/35* (2013.01)

(58) Field of Classification Search
CPC .......... H02J 7/35; H02S 40/38; H01G 9/2022; H01G 9/2031; H01G 9/2068; H01L 31/022425; Y02E 10/542
USPC .................................................. 136/256, 244
See application file for complete search history.

(56) References Cited

U.S. PATENT DOCUMENTS

| | | | | |
|---|---|---|---|---|
| 5,639,672 A * | 6/1997 | Burd | ................ | C12Q 1/005 422/82.01 |
| 7,426,071 B2 * | 9/2008 | Song | ................ | G02F 1/153 359/265 |
| 7,655,860 B2 * | 2/2010 | Parsons | ................ | B82Y 10/00 136/243 |
| 7,691,295 B2 * | 4/2010 | Lee | ................ | H01G 9/2031 252/518.1 |
| 7,838,065 B2 * | 11/2010 | Wei | ................ | H01G 9/2022 427/123 |
| 7,935,263 B2 * | 5/2011 | Duerr | ................ | H01G 9/2031 216/24 |
| 7,981,261 B2 * | 7/2011 | Rajh | ................ | C01B 3/042 136/252 |
| 2003/0062080 A1 * | 4/2003 | Satoh | ................ | H01G 9/20 136/256 |
| 2006/0070651 A1 * | 4/2006 | Kang | ................ | H01G 9/2022 136/256 |
| 2006/0278267 A1 * | 12/2006 | Miyazawa | ................ | H01G 9/2004 136/252 |

(Continued)

OTHER PUBLICATIONS

Hsu, et al., A dye-sensitized phto-supercapacitor based on PProDOT-Et2 thick films, Journal of Power Sources, 2010, 195 (18).

Miyasaka, et al., Dyesensitized photocapacitors fabricated with ionic liquid electrolytes for power generation and stoage, meeting abstracts, 2012, MA2012-02 (38).

(Continued)

*Primary Examiner* — David V Henze-Gongola
*Assistant Examiner* — Tarikh Rankine
(74) *Attorney, Agent, or Firm* — Thomas | Horstemeyer, LLP

(57) ABSTRACT

In one embodiment, a solar cell having internal storage capacity includes a working electrode, a counter electrode, an electrolyte provided between the electrodes, and a composite layer of material applied to an inner side of the working electrode, the layer comprising a photosensitive dye and a conducting polymer, wherein the conducting polymer is capable of storing energy generated within the cell.

17 Claims, 7 Drawing Sheets

(56) References Cited

U.S. PATENT DOCUMENTS

| | | | | |
|---|---|---|---|---|
| 2008/0041438 | A1* | 2/2008 | Saito | H01G 9/2018 136/244 |
| 2010/0326505 | A1* | 12/2010 | Ryu | H01G 9/2022 136/255 |
| 2011/0023955 | A1* | 2/2011 | Fonash | B82Y 20/00 136/256 |
| 2011/0204020 | A1* | 8/2011 | Ray | B82Y 25/00 216/13 |
| 2011/0220205 | A1* | 9/2011 | Jang | H01G 9/2031 136/263 |
| 2011/0303261 | A1* | 12/2011 | Holliman | H01G 9/2059 136/244 |
| 2012/0267240 | A1* | 10/2012 | Ke | C25B 1/003 204/242 |
| 2013/0056068 | A1* | 3/2013 | Ko | H01G 9/2031 136/259 |
| 2013/0092237 | A1* | 4/2013 | Takshi | H01M 8/16 136/263 |

OTHER PUBLICATIONS

Nagai, et al., Energy storable dye sensitized solar cell with polypyrrole electrode, Chemical Communictions, 2004, (8).

Liu, et al., A solar rechargeable battery based on polymeric charge storage electrodes, Electrochemistry Communications, 2012, 16(1).

Saito, et al., Energy-storable dye-sensitized solar cells with interdigitated nafion/polypyrrole-PT Comb-like Electrodes, Chemistry Letters, 2010, 39(5).

Skunik-Nuckowska, et al., Integration of solid-state dye-sensitized solar cell with metal oxide charge storage material into photoelectrochemical capacitor, Journal of Power Sources, 2013, 234 (0).

Mini, et al., Design and development of an integrated device consisting of an independent solar cell with electrical storage capacity, Progess in Photovoltaics: Research and applications, 2013, 21 (5).

* cited by examiner

FIG. 4(a)
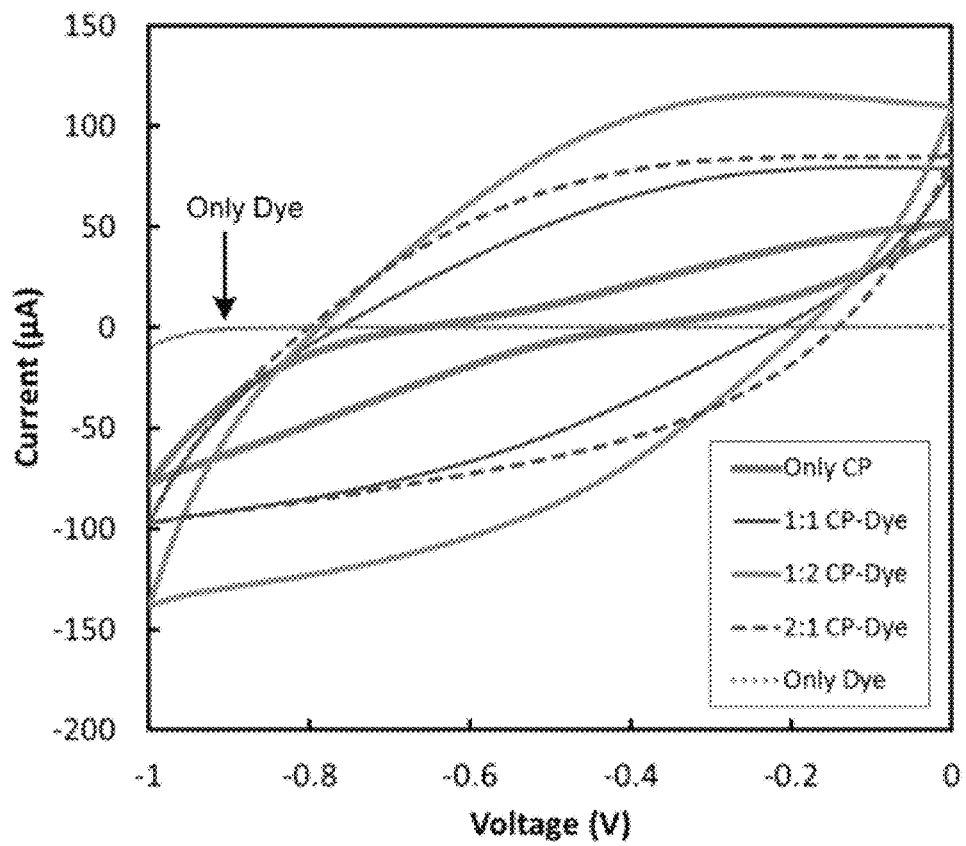
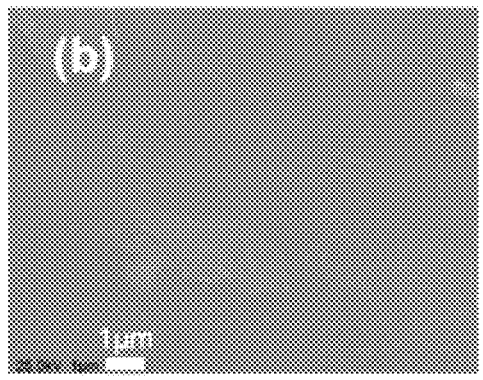
FIG. 4(b)
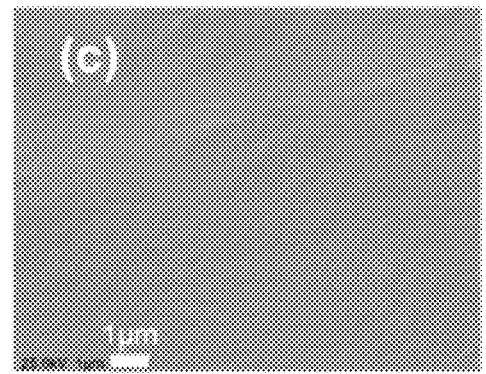
FIG. 4(c)

FIG. 7(a)
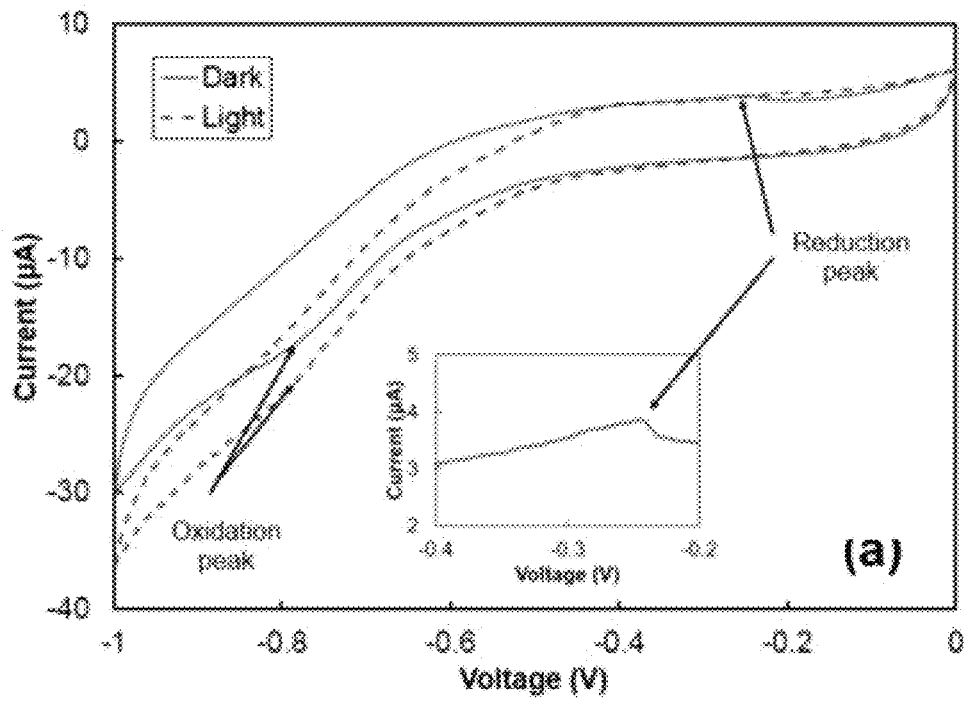
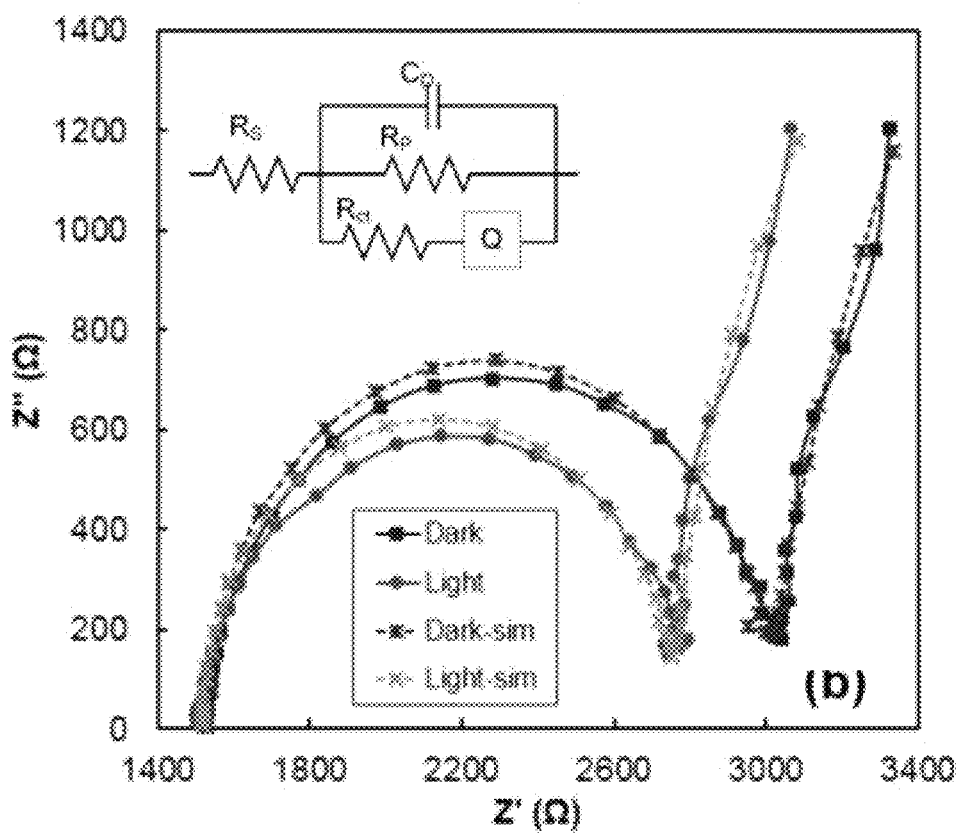
FIG. 7(b)

SOLAR CELLS HAVING INTERNAL ENERGY STORAGE CAPACITY

CROSS-REFERENCE TO RELATED APPLICATION(S)

This application claims priority to U.S. Provisional Application Ser. No. 61/893,487, filed Oct. 21, 2013, which is hereby incorporated by reference herein in its entirety.

BACKGROUND

Conventional solar cells are able to deliver electrical energy only when the cells are illuminated. Also, the output of electric current from the cells directly changes with light intensity. These characteristics create challenges in the real-world implementation of solar cells because no power can be generated at night and temporary blockages of sunlight (e.g., because of passing clouds) result in sudden changes in the output current.

Because of these limitations, external energy storage devices, such as batteries or supercapacitors, are required for conventional solar cell applications. While such energy storage devices address the limitations of conventional solar cells, they create other problems. For example, having to associate solar cells with independent energy storage devices reduces the overall energy conversion efficiency of the solar energy system. In addition, the limited lifetime of and the maintenance requirements for the energy storage devices increase the costs of the solar energy systems. Furthermore, systems that use batteries may not be environmentally friendly.

In view of the above discussion, it can be appreciated that it would be desirable to have a solar energy system that does not require independent energy storage devices.

BRIEF DESCRIPTION OF THE DRAWINGS

The present disclosure may be better understood with reference to the following figures. Matching reference numerals designate corresponding parts throughout the figures, which are not necessarily drawn to scale.

FIG. 3($a$) shows the open circuit voltage, FIG. 3($b$) shows the short circuit current in the dark and light, and FIG. 3($c$) shows the cyclic voltammetry (CV) in the dark with a scan rate of 50 mV s−1.

FIG. 4($a$) is a graph that shows CV results from devices with only conducting polymer, only dye, and 1:1, 1:2, and 2:1 conducting polymer-dye composite electrodes.

FIG. 4($b$) is a scanning electron microscopy (SEM) image of an electrode having only conducting polymer.

FIG. 4($c$) is a SEM image of an electrode having a 1:2 conducting polymer-dye composite film.

FIG. 7($a$) is a graph that shows CVs in dark and light with a slow scan rate (2 mV s−1). The inset graph shows the reduction peak under influence of the current knee.

FIG. 7($b$) is a graph that shows electrochemical impedance spectroscopy (EIS) in the dark and light. A model for the cell is shown inside the figure.

DETAILED DESCRIPTION

As described above, it would be desirable to have a solar energy system that does not require independent energy storage devices. Disclosed herein are solar cells that have internal energy storage capacity such that the cells internally store energy when they are not exposed to light or when the energy consumed from the cells is less than the energy generated by the cells. In some embodiments, the solar cells comprise electrochemical solar cells that include a transparent electrode having a composite layer of material (e.g., coating) that includes a photosensitive dye and a conducting polymer. As with conventional solar cells, the cells are able to deliver energy to a load in the presence of light. Unlike conventional solar cells, however, if no load is connected or if the consumed energy is less than the generated energy, the cells internally store the excess energy like a supercapacitor. The stored energy can be delivered to the load even in the dark and the cycle can be repeated by charging the cell with light again.

In the following disclosure, various specific embodiments are described. It is to be understood that those embodiments are example implementations of the disclosed inventions and that alternative embodiments are possible. All such embodiments are intended to fall within the scope of this disclosure.

Figure 1:
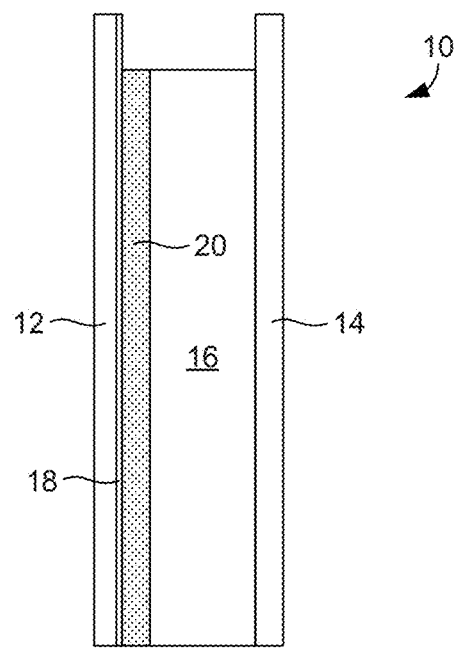
FIG. 1 is a schematic side view of an embodiment of a solar cell having internal energy storage capacity.

FIG. 1 schematically illustrates an example solar cell 10 that has internal energy storage capacity. As shown in the figure, the cell 10 generally includes a working electrode 12, a counter electrode 14, and an electrolyte 16 that is positioned between the electrodes. The working electrode 12 is a transparent electrode. In some embodiments, the working electrode 12 comprises a layer of glass that is coated with a conductive coating 18, such as a coating of indium tin oxide (ITO) or fluorine-doped tin oxide (FTO). In some embodiments, the counter electrode 14 comprises a layer of highly porous activated carbon paper. The electrolyte 16 can comprise aqueous and/or non-aqueous electrolytes, as well as ionic conductors. For example, the electrolyte 16 can comprise an aqueous solution of 0.75 mM Methyl Viologen (MV) in a 0.1 M Tris-buffer (pH 8.0).

As is further shown in FIG. 1, a composite layer 20 of material is applied to the inner surface of the working electrode 12, i.e., on the conductive coating 18 formed on the electrode. In some embodiments, the composite layer 20 comprises a mixture of a photosensitive dye and a conducting polymer. Of course, more than one dye and/or conducting polymer could be used in the mixture, if desired. The dye can comprise one or more of an organic dye, a porphine-based dye, and a ruthenium-based dye, as well as biomolecules. The conducting polymer can comprise conjugated molecules, which can comprise one or more short organic molecules, oligomers, and polymers. For example, the composite layer 20 can comprise a mixture of ZnTPP (5,10,15, 20-tetraphenyl-21H,23H-porphine) dye and PEDOT:PSS (Poly(3,4-ethylenedioxythiophene)-poly(styrenesulfonate)) conducting polymer. In some embodiments, the material of the composite layer 20 can be formed by mixing the photosensitive dye with a solution of conducting polymer, casting the mixture on the transparent electrode 12, and air drying the mixture before using the electrode in the cell 10. In some embodiments, the ratio of conducing polymer to photosensitive dye can be approximately 1:10 to approximately 9:10.

Figure 2A:
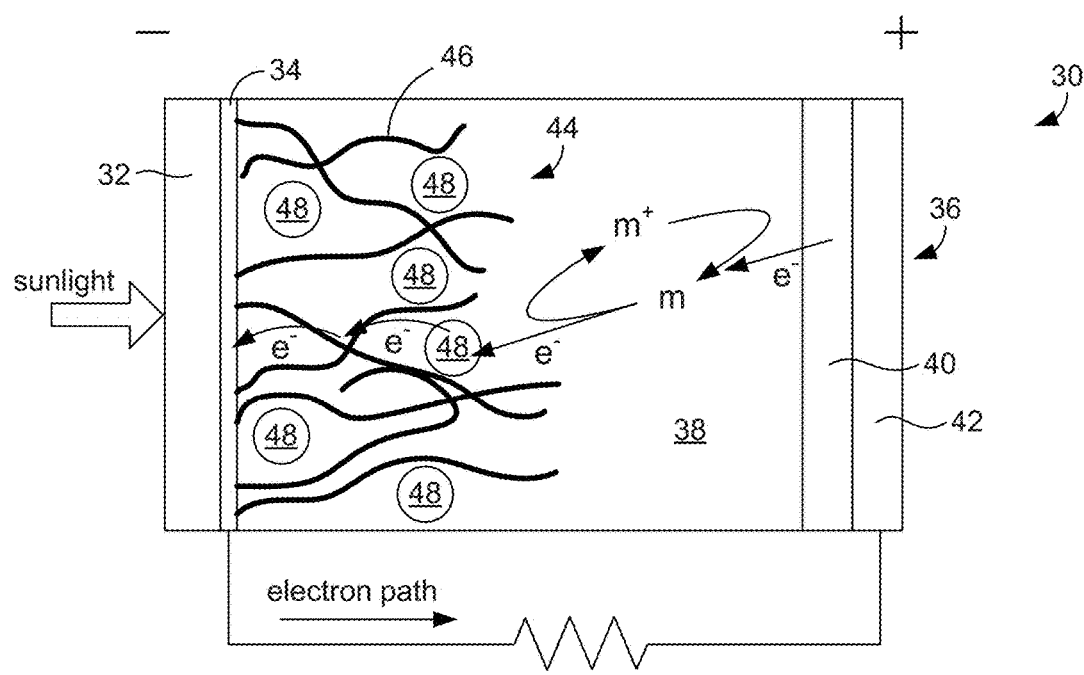
FIG. 2A is a schematic side view of a further embodiment of a solar cell having internal energy storage capacity, illustrating electron transfer during simultaneous energy generation and consumption.
Figure 2B:
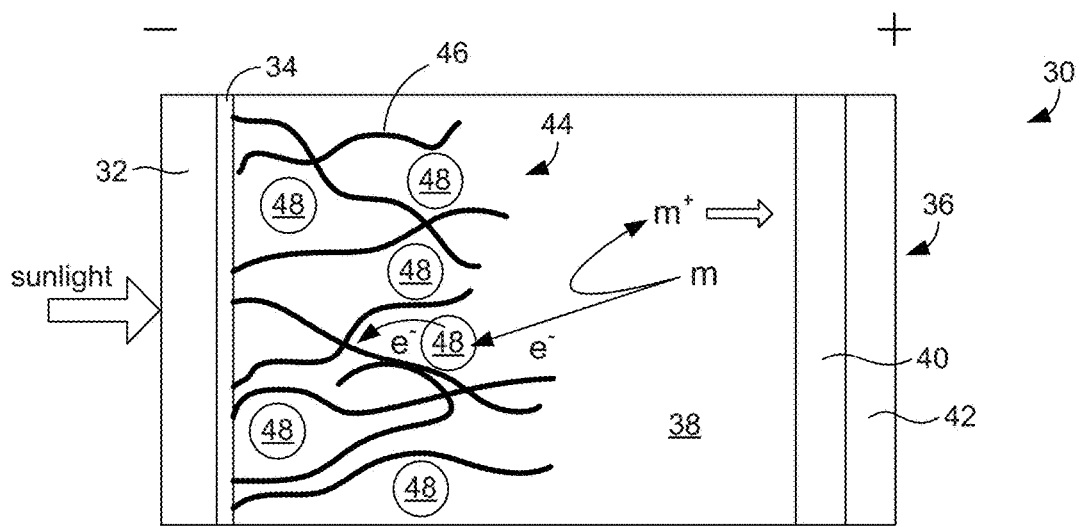
FIG. 2B is a schematic side view of the solar cell of FIG. 2A, illustrating electron transfer during energy generation without energy consumption.
Figure 2C:
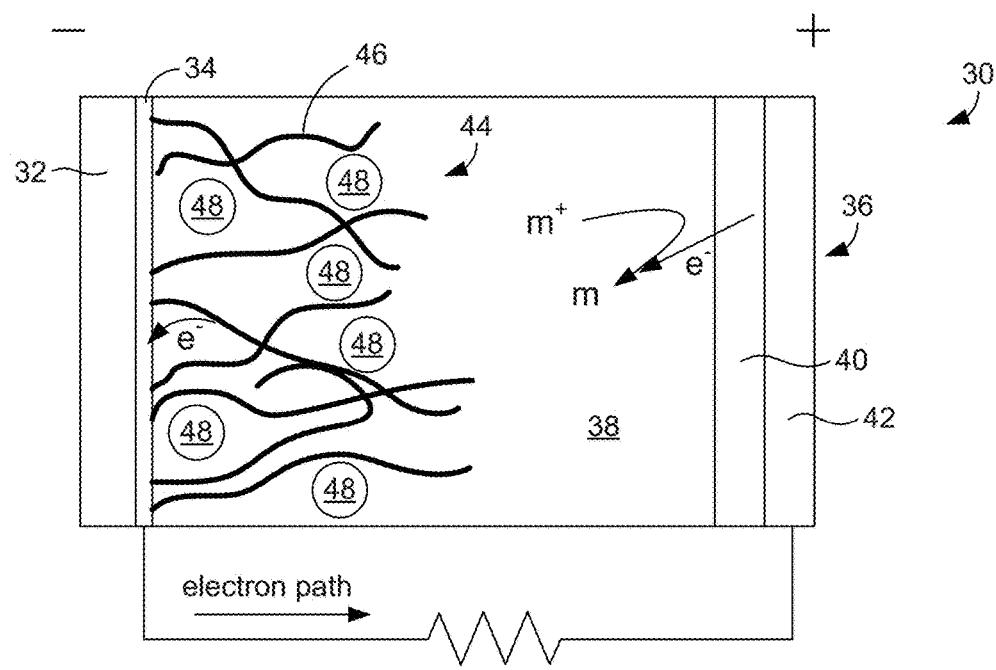
FIG. 2C is a schematic side view of the solar cell of FIG. 2A, illustrating electron transfer during energy consumption without energy generation.

When the solar cell 10, and more particularly the working electrode 12, is exposed to light, the molecules of the photosensitive dye absorb photons of the light and are excited to a state in which their electrons are in a higher energy level than their ground state. In conventional dye-sensitized solar cells (DSSCs), the excited electrons would be directly transferred to the conductive coating of the working electrode when a load was applied to the cell. In the case of the solar cell 10, however, the excited electrons are transferred to the conducting polymer within the composite layer 20 through a hopping or tunneling effect. If a load is applied to the cell 10 while it is generating energy, the conducting polymer behaves as a conductor to transfer charges to the conductive coating 18 of the working electrode 12 while the opposite charges are transferred to the counter electrode 14 via mediators in the electrolyte 16. This process is depicted in FIG. 2A, which schematically illustrates a solar cell 30 that includes a working electrode (anode) 32 having a conductive coating 34, a counter electrode (cathode) 36, and an electrolyte 38. In this embodiment, the counter electrode 36 comprises a layer of activated carbon paper 40 and a metal layer 42. A composite layer 44 is provided on the working electrode 32 that includes a conducting polymer 46 mixed with dye molecules 48. As shown in FIG. 2A, negative charges are provided to the conductive coating 34 and positive charges are provided to the counter electrode 36 with mediators, m, within the electrolyte 38. If the cell 10 is not connected to a load (i.e., in an open-circuit condition) or if the charge photogeneration rate has a higher rate than the rate of charge consumption through the load, the charges transferred to the conducting polymer 46 from the dye molecules 48 generate a build-up potential. The charge on the conducting polymer 46 can then be stored by either a change in the oxidation state of the conducting polymer or by the conducting polymer forming a double-layer capacitance. Regardless, the cell 30 can be discharged by connecting the cell to a load. Also, the recombination process between the mediators, m, and the conducting polymer 46 can discharge the cell 30 through a leakage process. FIG. 2B illustrates an open-circuit condition (i.e., energy generation without consumption) and shows a charge being transferred to the conducting polymer 46. FIG. 2C shows the solar cell 30 when a load is applied to the solar cell 30 when it is not exposed to sunlight (i.e., energy consumption without generation).

Solar cells having configurations similar to those described above were fabricated for testing purposes. ITO-coated PET, porphyrin dye (5,10,15,20-tetraphenyl-21h, 23h-porphine), PEDOT:PSS (1.3 wt % dispersion in water), Triton X-100, ethylene glycol, methyl viologen (MV), and Tris were all purchased from Sigma-Aldrich. Carbon paper was purchased from Y-carbon for the counter electrode. Ruthenium (Ru) based dye (N749) was obtained from Solaronix. The electrical and electrochemical measurements, including open circuit voltage test, current measurement, cyclic voltammetry (CV) and electrochemical impedance spectroscopy (EIS), were performed using a desktop computer connected to a VersaSTAT 4 potentiostat. The cells were placed in a dark box connected to a solar simulator (RST, Radiant Source Technology). The incident light intensity was 80 mW cm$^{-2}$ (AM 1.0) and the illumination time was manually controlled by turning on and off the instrument shutter. The optical absorption spectrum was measured using a Thermo Scientific (Evolution 201) UV-Vis spectrophotometer.

1.25 mg of the porphyrin (or N749) dye was dissolved in 2.5 ml of isopropanol (acetonitrile for N749). 2.5 ml of the conducting polymer solution was prepared by mixing 5 wt % ethylene glycol and 3 wt % Triton X-100 in the PEDOT:PSS. Different ratios (1:0, 1:1, 1:2, 2:1, and 0:1) of the conducting polymer and dye solutions were mixed and sonicated for 5 to 20 minutes to achieve a homogeneous solution. Kapton tape was used to make a rectangular mask (1.0 cm×0.5 cm) on the ITO electrode. 10 μl of the mixed solution was drop cast on the electrode and dried on a hotplate for 5 minutes at 120° C. to make the composite film on the transparent electrode. The electrode and a piece of Y-carbon (as the counter electrode) were placed in a disposable cuvette which was filled with the electrolyte (1 mM MV in 0.1 M Tris buffer solution) to cover the composite film. The apparent surface area of the carbon electrode in the solution was estimated to be 1.0 cm×0.5 cm.

Figure 3:
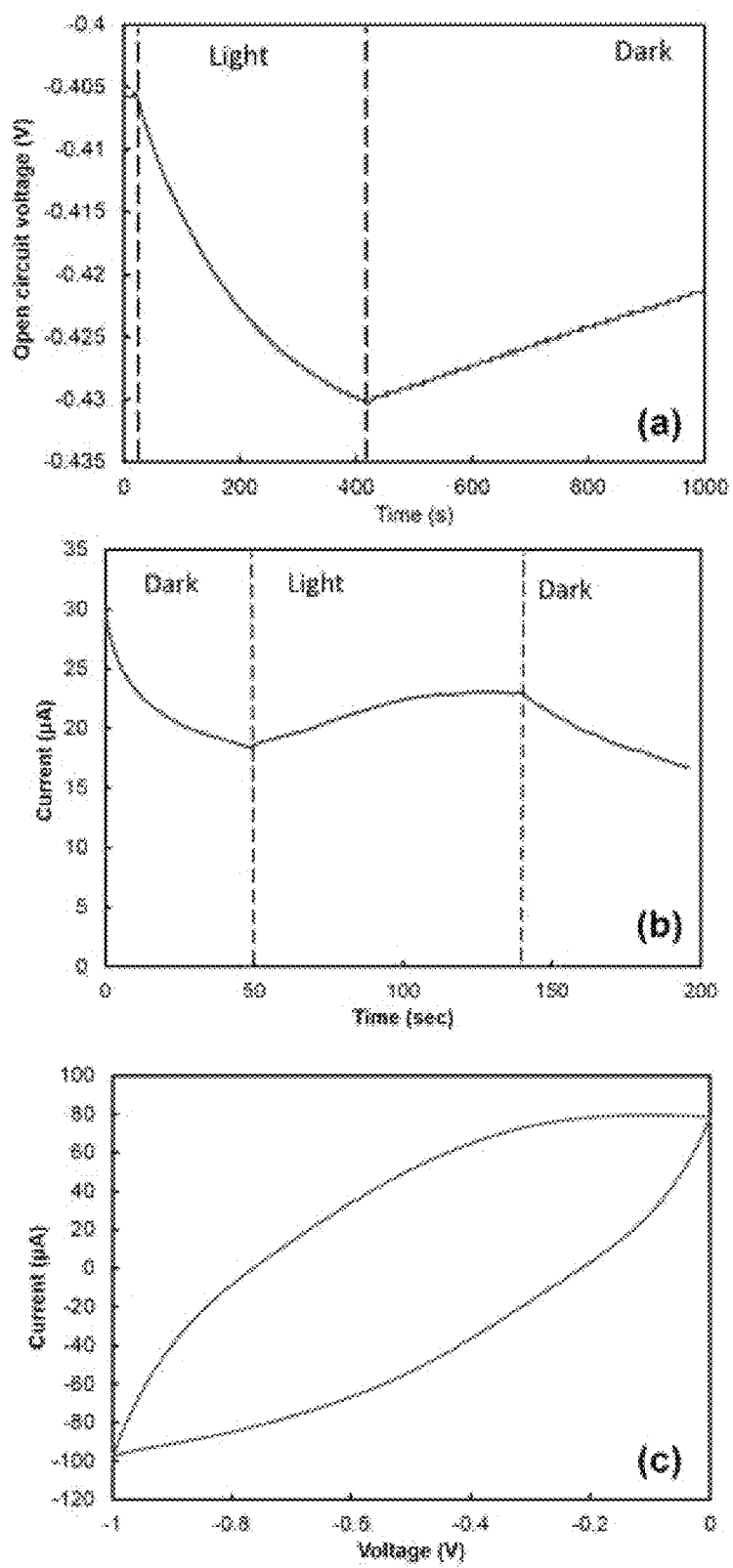
FIG. 3 comprises graphs that show photovoltaic and energy storage effects in a solar cell having a PEDOT:PSS-porphyrin dye composite electrode.

A composite film was prepared by drop casting a mixed solution of 1:1 ratio of PEDOT and porphyrin dye solutions on an ITO electrode. The electrode with 1:1 conducting polymer-dye was used as the working electrode in a cell with a porous carbon electrode (counter electrode) and an electrolyte with 1 mM methyl viologen (MV) in Tris buffer. The cell was kept in the dark for about one hour until a stable open circuit voltage was achieved. The cell was the illuminated for 400 seconds using the solar simulator. As shown in FIG. 3(a), the open circuit voltage across the cell in the dark was 405 mV (the negative value shows that the composite film was the negative terminal of the device). The cell voltage (absolute value) was gradually increased from 405 mV to 431 mV in 400 seconds of illumination. After turning off the light, unlike conventional DSSCs, the voltage did not immediately drop to the dark value. Instead, a gradual change was observed and the magnitude of the cell voltage reached 421 mV in 580 seconds after the cessation of light. The gradual increase in the cell voltage in the light implies the energy storage effect (charging the "supercapacitor"). A simple explanation is that, under the open circuit condition, the photoexcited charges (generated in the composite) accumulate on the conducting polymer and charge the working electrode. The interaction between MV$^+$ ions in the electrolyte and the positive charge on the composite can also oxidized the ions and convert them to MV$^{++}$ (MV$^+$→MV$^{++}$+ e$^-$). The oxidized ions (MV$^{++}$) diffuse to the counter electrode where a double layer charge can be formed on the surface of the carbon electrode. The slow change in the voltage after illumination shows the leakage effect in the supercapacitor. Nevertheless, the device was able to store a part of the photogenerated charges after approximately 10 minutes.

The photovoltaic and energy storage effects were studied by illuminating the cell for another 400 seconds under the open circuit conditions. Immediately after turning off the light, the short circuit current was recorded. As shown in FIG. 3(b), the stored charges in the device resulted in a dark current that decreased from 30 pA to 18 pA in 50 seconds. The low short circuit current and gradual discharge of the device indicates a relatively large internal resistance. While the short circuit current was monitored, the light source was turned on for 90 seconds. The current increased to 23 pA at the end of the illumination cycle and decreased again when the light was turned off. The positive current and negative open circuit voltage indicate a photovoltaic power generation by the device. The increase in the short circuit current under illumination also shows the feasibility of delivering part of the photogenerated charges directly to a load and storing some of the charges. It should be mentioned that, due to the storage effect, the conventional current-voltage test cannot be applied to characterize the photovoltaic effect and calculate the efficiency of the device. However, in the device's current form with relatively low short circuit current, the photo conversion efficiency is very low.

The storage capacitance of the device was measured using the CV method. Since the working electrode voltage was negative, the voltage range in the CV measurement was set between 0 V and −1 V (FIG. 3(b)). The value of the capacitance was estimated to be approximately 1.04 mF from the width of the CV loop at −0.5 V.

Various composite electrodes were fabricated with conducting polymer-dye ratios of 1:0 (only conducting polymer), 1:1, 1:2, 2:1, and 0:1 (only dye) to investigate the effect of dye concentration on the energy storage and photovoltaic effect of the device. FIG. 4(a) shows the CV results from the devices with those electrodes. As expected, the electrode with only a dye coating had very negligible capacitance, likely due to the lack of porosity. The electrode with one part conducting polymer and two parts dye showed the largest capacitance of 1.76 mF, and the electrode with only conducting polymer had a capacitance of only 0.19 mF. To understand the capacitance increase in the composite electrode, scanning electron microscopy (SEM) images were taken (FIGS. 4(b) and 4(c)), which clearly show the structural difference between the composite and the conducting polymer films. It is likely that the micro cracks on the composite material enhanced the film porosity.

Figure 5:
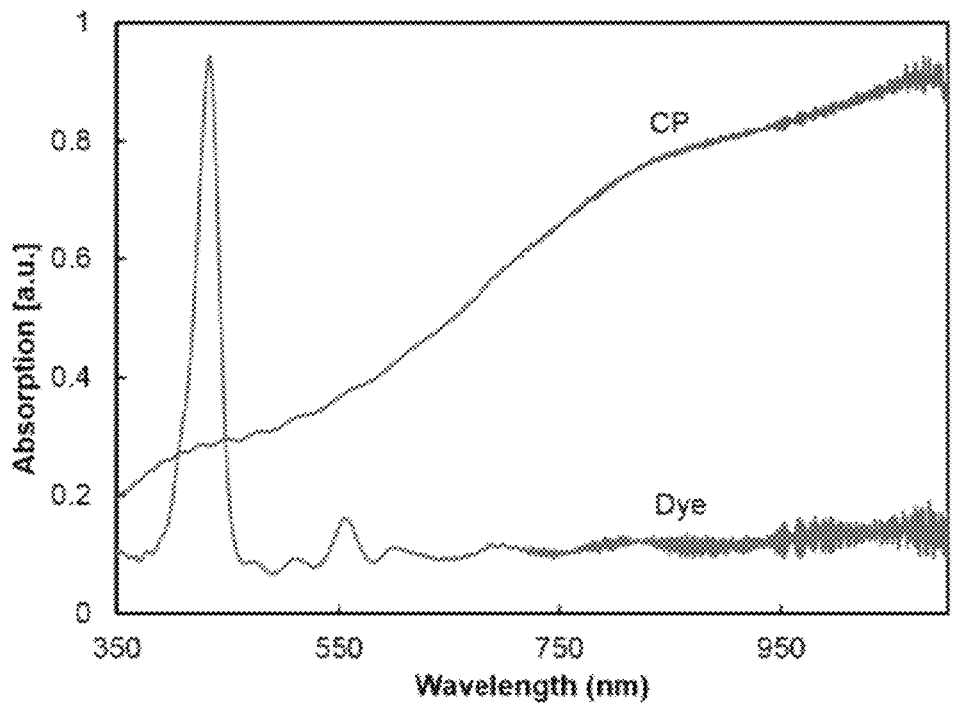
FIG. 5 is a graph showing optical absorption of the films of only conducting polymer and only dye on two indium tin oxide (ITO) electrodes.

The optical absorption of a conducting polymer film and a layer of the dye on two electrodes was studied using the UV-Vis spectroscopy method. As shown in FIG. 5, the conducting polymer has broad absorption in the red and infrared range, whereas the dye is responding strongly to 432 nm wavelength. Hence, the high energy photons are absorbed by the dye and the polymer can absorb low energy photons. Also, the broad absorption spectrum in the conducting polymer suggests the photovoltaic effect in the only conducting polymer film.

Figure 6:
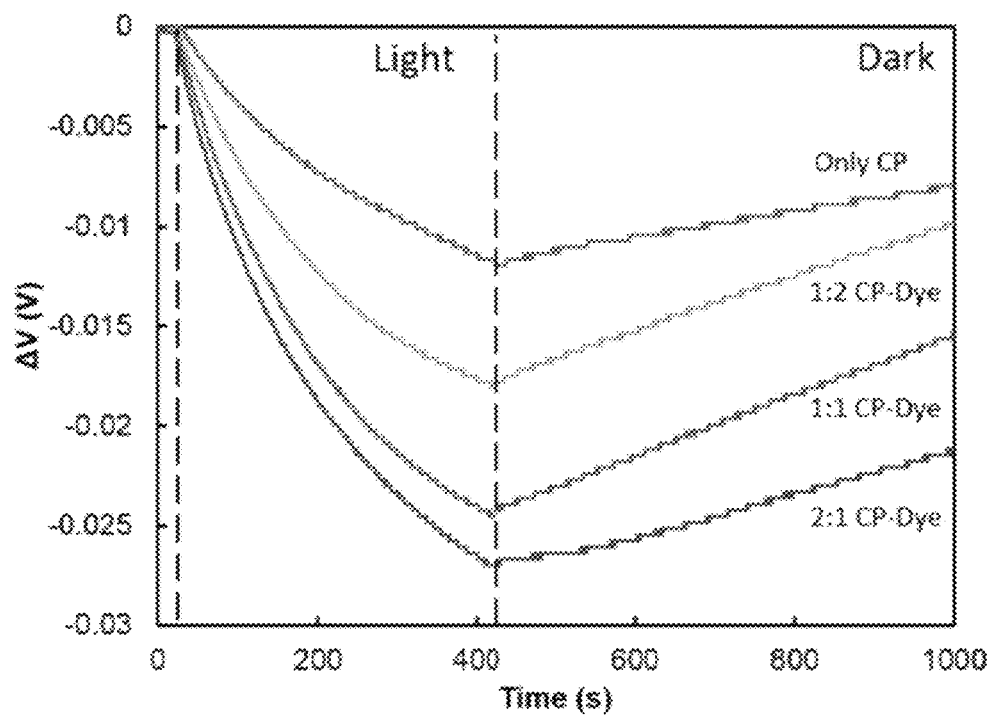
FIG. 6 is a graph that shows the change in the open circuit voltage in different cells under illumination and after cessation of light.

The photovoltaic effect in different electrodes were studied by monitoring the change in the open circuit voltages in the dark and light (FIG. 6). Since the capacitance of the electrode with only dye was negligible (FIG. 4(a)), only the electrodes with the conducting polymers were considered in the photovoltaic test. Due to the energy storage effect, different devices showed different open circuit voltages in the dark, even after keeping devices in the short circuit mode (in the dark) for a few hours. Therefore, for a comparative study, only the change in the open circuit voltage from the dark (ΔV) is presented in FIG. 5. The largest ΔV was −27 mV from the device with 2:1 conducting polymer-dye composite. The electrode with only conducting polymer showed the lowest ΔV (−12 mV). Considering the absorption spectrum in FIG. 5, it appears that the absorption of high energy photons by the dye molecules enhances the photovoltaic effect. However, the larger ΔV in the composite of 2:1 conducting polymer-dye than the electrodes with higher dye concentration (1:1 and 1:2 conducting polymer-dye) shows the importance of the ratio between the dye and the conducting polymer for the photovoltaic effect.

Considering the semiconducting properties of conducting polymers, the structure of the device is similar to a DSSC in which a porous layer of $TiO_2$ nanoparticles (semiconducting material) and a layer of dye molecules are applied as the photoactive electrode. However, there is no charge storage in a DSSC. The mechanism of the photogenerated charge storage in the composite film is likely that the charge is stored on the polymer chains by changing the oxidation state of the polymer film (pseudo capacitive charge storage).

The CV experiment with very low scan rate (2 $mV \cdot s^{-1}$) was performed in the dark and light on the cell (two probe experiment) with 2:1 conducting polymer-dye electrode to investigate the oxidation state of the composite film. As shown in FIG. 7(a), an oxidation peak was observed at −0.78 V. Also, a broad reduction peak can be seen around −245 mV (the peak is more pronounced in the CV of the dark experiment-inset figure). The reduction peak is under influence of the knee current. Due to the small peak amplitudes, the redox peaks could not be seen in the CV with EIS on the cell with the 2:1 conducting polymer-dye electrode. The Nyquist plot is presented in FIG. 7(b). The impedance at high frequencies showed a resistive behavior with the series resistance of 1.52 kΩ. Such a large resistance explains the limited short circuit current in the cell (FIG. 3(b)). To reduce the resistance, an electrolyte with higher ion concentration can be used. Also the contact resistance between the composite film and the ITO electrode can be improved. The semi-circle with almost linear tail in the Nyquist plot suggests that the polarization is due to a combination of diffusion and kinetic processes.

The presented equivalent circuit model (inset FIG. 7(b)) was applied to simulate the cell response in the dark and light using ZSim software. In the model, $R_S$ represents the series resistance, $C_D$ is the double layer capacitance, $R_P$ is the parallel resistance, $R_{ct}$ is the charge transfer resistance, and Q is the constant phase element with power of n. The estimated values of the elements in the model are listed in Table 1. In both the dark and light cases, the estimated value for n is close to 1, which implies a capacitive behavior (transmission line model). The values of $C_D$, Q, and n were nearly the same in the dark and light. Hence, as expected, the effect of light on the capacitive behavior of the cell was negligible. The largest difference was observed in $R_{ct}$ and $R_P$, which again shows higher charge transfer rate in light than in the dark and larger cell current in light.

TABLE 1

Comparison between impedance parameters in the dark and light.

| Description | $R_s$(kΩ) | $C_D$(μF) | $R_p$(kΩ) | $R_{ct}$(kΩ) | Q(S.sec^n) | n |
|---|---|---|---|---|---|---|
| Dark | 1.52 | 4.10 | 9.11 | 1.77 | 8.26E−04 | 0.92 |
| Light | 1.52 | 4.02 | 6.89 | 1.51 | 82.28E−04 | 0.96 |

Figure 8:
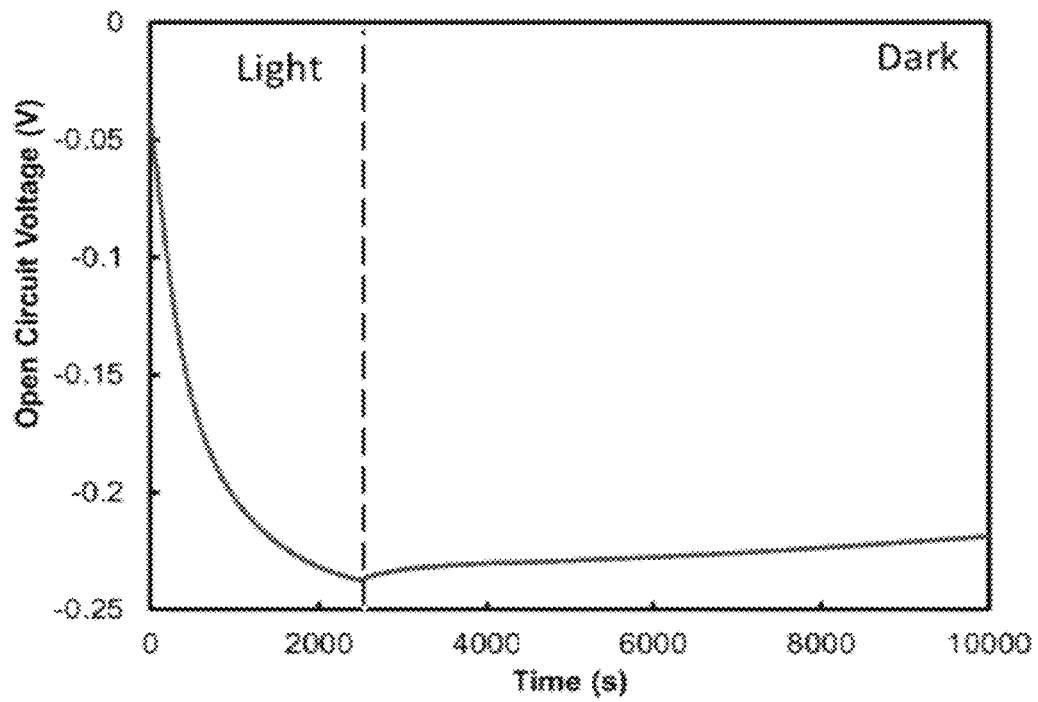
FIG. 8 is a graph of the open circuit voltage of a cell with a conducting polymer and N749 dye composite electrode in light and dark.

The concept of using a conducting polymer-dye composite for making photovoltaic devices with embedded energy storage was further developed by using a Ru-based dye molecule (N749 from Solaronix) instead of the porphyrin dye in a 1:1 conducting polymer-dye composite. The photovoltaic test of the device showed a slower charging cycle with a large potential difference under illumination. As shown in FIG. 8, the cell voltage (absolute value) increased from 42 mV to 240 mV in 2500 seconds (ΔV=198 mV). Also, the cell showed a high charge storage stability. After turning off the light, the open circuit voltage reduced by only 20 mV (~10% of ΔV) in 2 hours. However, the short circuit current was in sub micro amp range (the result is not presented).

Further study on the charge transfer and energy levels at the dye and polymer molecules may be necessary to fully understand the mechanism of energy storage in the composite film. Also, the effect of ion concentration on the photovoltaic and energy storage effects can be investigated. Enhancing the photovoltaic effect and optimizing the energy storage properties can lead to a practical solar cell with embedded energy storage.

Figure 9:
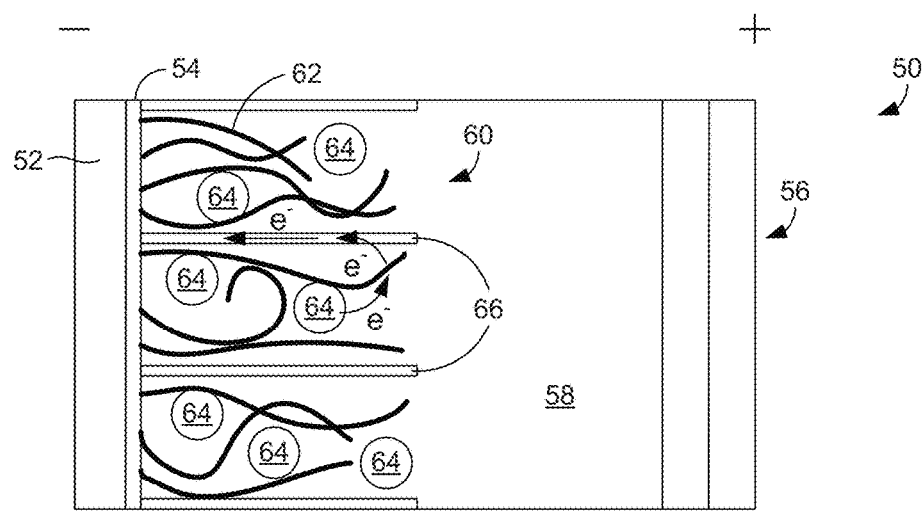
FIG. 9 is a schematic side view of a further embodiment of a solar cell having internal energy storage capacity, the cell including conductive nanowires that reduce internal resistance.

FIG. 9 illustrates a further solar cell 50 that internally stores energy. The cell 50 is similar to the cells described above in relation to FIGS. 1 and 2. Therefore, the cell 50 includes a working electrode (anode) 52 having a conductive coating 54, a counter electrode (cathode) 56, an electrolyte 58, and a composite layer 60 provided on the working electrode that includes a conducting polymer 62 mixed with dye molecules 64. Unlike the other cells, however, the cell 50 further includes conductive elements 66, in the form of nanowires, extending from the working electrode 52 and into the composite layer 60. The elements 66 reduce internal resistance within the cell 50. In some embodiments, the elements 66 are made of a metal oxide, such as zinc oxide (ZnO).

The invention claimed is:

1. A solar cell having internal storage capacity, the cell comprising:
    a working electrode;
    a counter electrode;
    an electrolyte provided between the electrodes; and
    a composite layer of material applied to an inner side of the working electrode, the composite layer comprising a mixture of a photosensitive dye and a conducting polymer, wherein the conducting polymer is capable of storing energy generated within the cell.

2. The solar cell of claim 1, wherein the working electrode is a transparent electrode.

3. The solar cell of claim 2, wherein the inner side of the transparent electrode comprises a conductive coating.

4. The solar cell of claim 1, wherein the working electrode comprises a layer of glass coated with indium tin oxide or fluorine-dope tin oxide.

5. The solar cell of claim 1, wherein the counter electrode comprises a layer of porous carbon.

6. The solar cell of claim 1, wherein the electrolyte comprises an aqueous electrolyte, a non-aqueous electrolyte, an ionic conductor, or a combination thereof.

7. The solar cell of claim 1, wherein the photosensitive dye comprises one or more of an organic dye, a porphine-based dye, and a ruthenium-based dye.

8. The solar cell of claim 1, wherein the conducting polymer comprises conjugated molecules.

9. The solar cell of claim 8, wherein the conjugated molecules comprise one or more of short organic molecules, oligomers, and polymers.

10. The solar cell of claim 1, further comprising conductive elements that extend outward from the working electrode and into the composite layer.

11. A solar cell having internal storage capacity, the cell comprising:
    a transparent working electrode having a conductive coating;
    a counter electrode;
    an electrolyte provided between the electrodes; and
    a composite layer of material applied to an inner side of the working electrode, the layer comprising a mixture including a photosensitive dye including one or more of an organic dye, a porphine-based dye, and a ruthenium-based dye and a conducting polymer including one or more of short organic molecules, oligomers, and polymers, wherein the conducting polymer is capable of storing energy generated within the cell.

12. A method for storing solar energy, the method comprising:
    absorbing solar energy with a photosensitive dye within a solar cell; and
    transferring electrons from the photosensitive dye to a conducting polymer within the solar cell, wherein the conducting polymer stores the electrons if the cell is not connected to a load or if a rate of charge photogeneration is higher than a rate of charge consumption through the load.

13. The method of claim 12, wherein the photosensitive dye is mixed with the conducting polymer to form a composite layer.

14. The method of claim 13, wherein the composite layer is formed on a working electrode of the solar cell.

15. The method of claim 12, wherein the photosensitive dye comprises one or more of an organic dye, a porphine-based dye, and a ruthenium-based dye.

16. The method of claim 12, wherein the conducting polymer comprises conjugated molecules.

17. The method of claim 16, wherein the conjugated molecules comprise one or more of short organic molecules, oligomers, and polymers.

* * * * *